United States Patent
Luo et al.

(10) Patent No.: US 7,855,576 B1
(45) Date of Patent: Dec. 21, 2010

(54) VERSATILE COMMON-MODE DRIVER METHODS AND APPARATUS

(75) Inventors: Mei Luo, San Jose, CA (US); Sergey Shumarayev, San Leonardo, CA (US); Thungoc M. Tran, San Jose, CA (US); Simardeep Maangat, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 1035 days.

(21) Appl. No.: 11/407,444

(22) Filed: Apr. 19, 2006

(51) Int. Cl.
*H03K 19/0175* (2006.01)
*H03K 19/003* (2006.01)

(52) U.S. Cl. ............................ 326/82; 326/33; 327/74
(58) Field of Classification Search .................. 326/21, 326/31–34, 82; 327/74, 75
See application file for complete search history.

(56) References Cited

U.S. PATENT DOCUMENTS

| | | | |
|---|---|---|---|
| 6,424,221 B1 * | 7/2002 | Korn | 330/282 |
| 6,469,547 B1 * | 10/2002 | Rabii | 327/74 |
| 6,888,370 B1 | 5/2005 | Luo et al. | |
| 7,095,263 B2 * | 8/2006 | Liu | 327/205 |
| 7,138,819 B2 * | 11/2006 | Hashimoto | 324/765 |

* cited by examiner

*Primary Examiner*—James Cho
(74) *Attorney, Agent, or Firm*—Ropes & Gray LLP

(57) ABSTRACT

Methods and apparatus are provided for selectively setting a CM voltage for a transceiver, reducing the effect of current mismatch, and generating a voltage step that can be used for receiver detection. A circuit of the invention can include voltage generator circuitry operable to generate a plurality of voltage signals of substantially different voltages. The circuit can also include multiplexer circuitry with voltage inputs coupled to the voltage signals. The multiplexer circuitry can be operable to select a reference signal from among the voltage inputs. In addition, the circuit can include operational amplifier ("op-amp") circuitry with a first input coupled to the reference signal and a second input coupled to an output signal of the op-amp circuitry.

21 Claims, 3 Drawing Sheets

US 7,855,576 B1

VERSATILE COMMON-MODE DRIVER METHODS AND APPARATUS

BACKGROUND OF THE INVENTION

This invention relates to transceiver circuitry. More particularly, this invention relates to common-mode drivers for use with transceiver circuitry.

It is relatively well known to use transceiver circuitry, which can include transmitter circuitry and receiver circuitry associated with each other, to communicate signals between integrated circuits ("ICs") or within a single IC. High-speed transceiver circuitry often employs a pair of complementary ("differential") signals to convey information, where a given bit of information can be indicated by the voltage difference between the two signals. For instance, a logical "0" can be communicated by transmitting and receiving a pair of differential signals where the voltage of the first signal is substantially lower than the voltage of the second signal. Similarly, a logical "1" can be communicated by transmitting and receiving a pair of differential signals where the voltage of the first signal is substantially higher than the voltage of the second signal.

Several problems can exist when using transceiver circuitry. For instance, the common-mode ("CM") voltage (i.e., the average voltage of a pair of differential signals) of the transmitter circuitry can be substantially different from the CM voltage of the associated receiver circuitry. If the transmitter and receiver circuitries are coupled using a direct-current ("DC") arrangement, this mismatch of CM voltages can lead to current flowing from one part of the transceiver to another. This current flow can result in a settled CM voltage for the transceiver pair that is substantially different from both the transmitter circuitry's CM voltage and the receiver circuitry's CM voltage. In some cases, the settled CM voltage may be outside the acceptable voltage range of the transmitter circuitry, the receiver circuitry, or both, preventing successful communication between the two parts of the transceiver. In addition, the current flow discussed above can undesirably dissipate power within the system.

As another example, transmitter circuitry implemented with complementary metal oxide semiconductor ("CMOS") technology often includes at least two current sources, one "P-type" and one "N-type." If the current sources are of substantially equal strength, the transmitter circuitry's CM voltage can be substantially accurate. However, if the current sources do not substantially match each other, the resulting transmitter CM voltage can deviate substantially from the desired level. This phenomenon is often referred to as "P/N current mismatch." As discussed above, such deviation can render the transceiver substantially inoperative if the resulting transmitter CM voltage is outside an accepted range, result in undesirable power dissipation in the transceiver, or both. In addition, an inaccurate transmitter CM voltage can result in data errors that can adversely affect the integrity of the system.

As yet another example, there may be a need to generate a step voltage for purposes of receiver detection. For instance, the Peripheral Component Interconnect-Express ("PCI-E") communication protocol can support receiver detection by generating a transmission voltage that changes from one level to another, and measuring whether a transmitted signal changes relatively slowly or relatively quickly. If a functional receiver is coupled to the transmitted voltage signal, the delay resulting from the transmitter's termination resistance, the receiver's termination resistance, and the DC circuitry's capacitance (collectively, the "RC delay") can cause the transmitted signal to change relatively slowly. On the other hand, if no receiver is coupled to the transmitted voltage signal, the signal can change relatively quickly.

In view of the foregoing, it would be desirable to provide methods and apparatus that can selectively set a CM voltage for a transceiver, reduce the effect of current mismatch, and generate a voltage step that can be used for receiver detection. It would further be desirable to provide a single solution that can address all of the concerns discussed above.

SUMMARY OF THE INVENTION

In accordance with this invention, methods and apparatus are provided for selectively setting a CM voltage for a transceiver, reducing the effect of current mismatch, and generating a voltage step that can be used for receiver detection. In one embodiment, a circuit of the invention can include voltage generator circuitry operable to generate a plurality of voltage signals of substantially different voltages. The circuit can also include multiplexer circuitry with voltage inputs coupled to the voltage signals. The multiplexer circuitry can be operable to select a reference signal from among the voltage inputs. In addition, the circuit can include operational amplifier ("op-amp") circuitry with a first input coupled to the reference signal and a second input coupled to an output signal of the op-amp circuitry. It will be understood that, as used herein, the expression "coupled to" can be used to define either a direct or an indirect connection between two elements.

In another embodiment, a circuit of the invention can include selection circuitry operable to accept a plurality of voltage signals with substantially different voltages and select one of the signals as a reference output signal. The circuit of the invention can also include voltage follower circuitry operable to accept the reference output signal and generate a common-mode output signal whose voltage is driven to substantially a voltage of the reference output signal by a feedback loop.

In yet another embodiment, a method of the invention can generate a CM output signal. The method can include selecting a first voltage signal from among a plurality of voltage signals with substantially different voltages. The method can also include tracking the selected first voltage signal using a feedback loop to generate the CM output signal.

The invention therefore advantageously provides methods and apparatus for selectively setting a CM voltage for a transceiver, reducing the effect of current mismatch, and generating a voltage step that can be used for receiver detection. Advantageously, a single circuit or method of the invention can be used with transmitter circuitry, receiver circuitry, or receiver detection circuitry.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
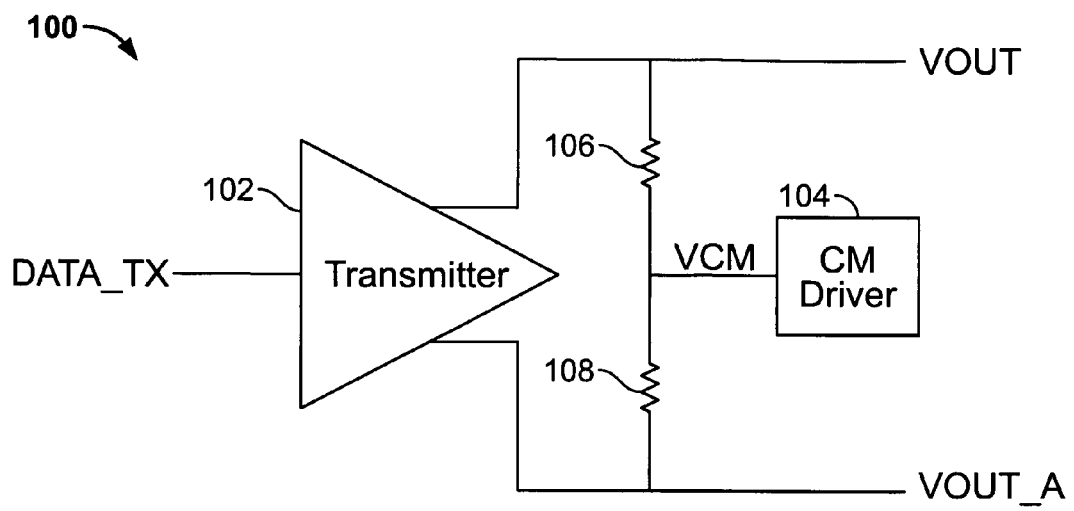
FIG. 1 is a circuit diagram showing an illustrative transmitter architecture according to an embodiment of the invention.

FIG. 1 is a circuit diagram showing an illustrative transmitter architecture 100 according to an embodiment of the invention. Transmitter architecture 100 can include transmitter circuitry 102, resistor circuitries 106 and 108, and CM driver circuitry 104. Transmitter circuitry 102 can be operative to transmit a pair of differential output signals VOUT and VOUT_A indicative of information DATA_TX. Transmitter circuitry 102 can include any appropriate circuitry and support any appropriate communication standards, such as low-voltage differential signaling ("LVDS") or current mode logic ("CML").

First differential signal VOUT can be coupled to CM driver circuitry 104 by first resistor circuitry 106, while second differential signal VOUT_A can be coupled to CM driver circuitry 104 by second resistor circuitry 108. In an embodiment of the invention, resistor circuitry 106 and resistor circuitry 108 can have substantially equivalent resistances, such that the voltage drop across them is also substantially equivalent. In this scenario, output signal VCM of CM driver circuitry 104 can have a voltage that is substantially equal to the average of voltages VOUT and VOUT_A. In an embodiment of the invention, resistor circuitries 106 and 108 can be on-chip termination resistors. In another embodiment of the invention, resistor circuitries 106 and 108 can be programmable, making them substantially independent from process, voltage, and temperature ("PVT") variation. Further detail about possible embodiments of resistor circuitries 106 and 108 can be found in U.S. patent application Ser. No. 10/645,932, filed Aug. 20, 2003, now U.S. Pat. No. 6,888,370, which is hereby incorporated by reference herein in its entirety.

CM driver circuitry 104 can be operative to hold signal VCM relatively steady at a selected reference voltage level using any appropriate technique (e.g., voltage follower circuitry or a feedback loop), thereby substantially reducing noise, jitter, or both on signal VCM. Such stabilizing effects can advantageously reduce the common mode rejection ratio (CMRR) for transmitted differential signals VOUT and VOUT_A, thereby improving signal integrity in the transceiver.

According to an embodiment of the invention, CM driver circuitry 104 can be operable to generate a selectable voltage for signal VCM. By providing a plurality of choices for CM voltage, CM driver circuitry 104 can advantageously allow transmitter architecture 100 to be used in a variety of applications and with a variety of receiver architectures. CM voltage VCM can preferably be dynamically selected to optimize the performance of transmitter architecture 100 according to an appropriate metric (e.g., speed or power consumption).

CM driver circuitry 104 can be operative to reduce effects that can arise when transmitter circuitry with a certain CM voltage is coupled to receiver circuitry with a different CM voltage (e.g., unnecessarily dissipating power or settling at a CM voltage that is invalid for the transmitter, the receiver, or both). For example, CM driver circuitry 104 can include circuitry (e.g., an operational amplifier ("op-amp")) that can substantially source deficient current or sink surplus current resulting from the voltage difference between the transmission circuitry and the receiver circuitry. Similarly, CM driver 104 can advantageously reduce the effects of P/N current mismatch from transmission circuitry 102 by substantially sinking or sourcing the current difference arising from the mismatched current sources.

In an embodiment of the invention, CM driver circuitry 104 can be operable to generate a voltage step, such that signal VCM rises or falls from a first predetermined voltage level to a second predetermined voltage level. Generating such a step can advantageously facilitate detection of receiver circuitry that may be coupled to differential signals VOUT and VOUT_A. For instance, if a voltage step generated by CM driver circuitry 104 results in a relatively slow transition in differential signals VOUT and VOUT_A, it can be inferred that those differential signals are subject to parasitic (e.g., resistive and capacitive) effects caused by the coupling of the transmitter to a functional receiver. On the other hand, if a voltage step generated by CM driver circuitry 104 results in a relatively fast transition in differential signals VOUT and VOUT_A, it can be inferred that those differential signals are not coupled to a functional receiver. Further details of the structure and operation of CM driver circuitry 104 is provided below in connection with FIG. 3.

Figure 2:
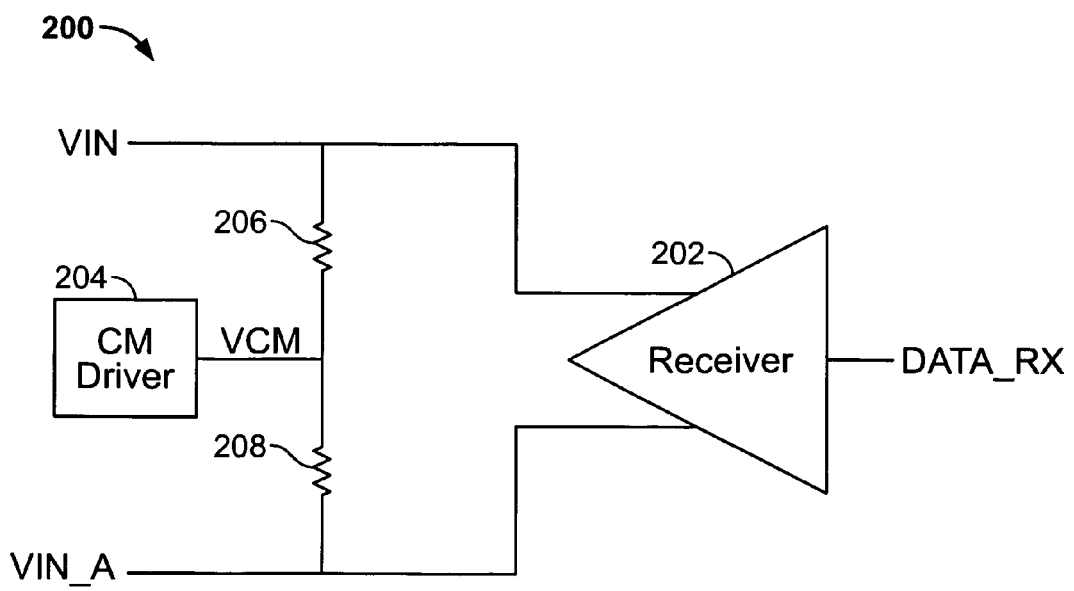
FIG. 2 is a circuit diagram showing an illustrative receiver architecture according to an embodiment of the invention.

FIG. 2 is a circuit diagram showing an illustrative receiver architecture 200 according to an embodiment of the invention. Receiver architecture 200 can include receiver circuitry 202, resistor circuitries 206 and 208, and CM driver circuitry 204. Transmitter circuitry 202 can be operative to receive a pair of differential input signals VIN and VIN_A indicative of information DATA_RX. Receiver circuitry 202 can include any appropriate circuitry and support any appropriate communication standards, such as low-voltage differential signaling ("LVDS") or current mode logic ("CML").

First differential signal VIN can be coupled to CM driver circuitry 204 by first resistor circuitry 206, while second differential signal VIN_A can be coupled to CM driver circuitry 204 by second resistor circuitry 208. In an embodiment of the invention, resistor circuitry 206 and resistor circuitry 208 can have substantially equivalent resistances, such that the voltage drop across them is also substantially equivalent. In this scenario, output signal VCM of CM driver circuitry 204 can have a voltage that is substantially equal to the average of voltages VIN and VIN_A. In an embodiment of the invention, resistor circuitries 206 and 208 can be on-chip termination resistors. In another embodiment of the invention, resistor circuitries 206 and 208 can be programmable, making them substantially independent from PVT variation. Further detail about possible embodiments of resistor circuitries 206 and 208 can be found in U.S. patent application Ser. No. 10/645,932, filed Aug. 20, 2003, now U.S. Pat. No. 6,888,370, which was previously incorporated by reference above.

In an embodiment of the invention, CM driver circuitry 204 can be substantially similar to CM driver circuitry 104 of FIG. 1. Thus, CM driver circuitry 204 can be operative to hold signal VCM relatively steady at a selected reference voltage level using any appropriate technique (e.g., voltage follower circuitry or a feedback loop), thereby substantially reducing noise, jitter, or both, on signal VCM. Such stabilizing effects can advantageously reduce the CMRR for received differential signals VIN and VIN_A, thereby improving signal integrity in the transceiver.

According to an embodiment of the invention, CM driver circuitry 204 can be operable to generate a selectable voltage for signal VCM. By providing a plurality of choices for CM voltage, CM driver circuitry 204 can advantageously allow receiver architecture 200 to be used in a variety of applications and with a variety of transmitter architectures. CM voltage VCM can preferably be dynamically selected to optimize the performance of receiver architecture 200 according to an appropriate metric (e.g., speed or power consumption). Further details of the structure and operation of CM driver circuitry 204 is provided below in connection with FIG. 3.

Figure 3:
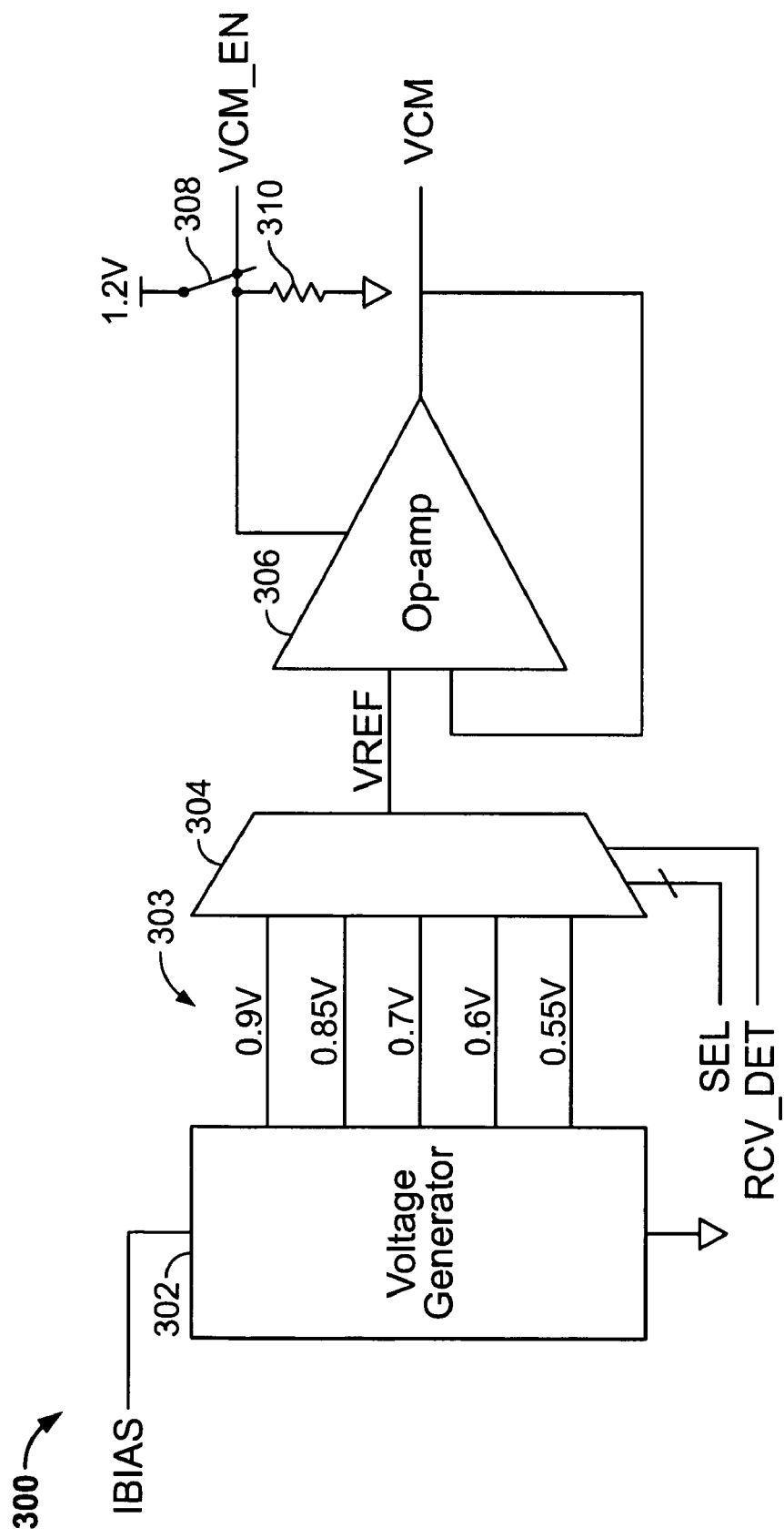
FIG. 3 is a circuit diagram showing illustrative CM driver circuitry according to an embodiment of the invention.

FIG. 3 is a circuit diagram showing illustrative CM driver circuitry 300 according to an embodiment of the invention. CM driver circuitry 300 can preferably be used as CM driver circuitry 104 of transmitter architecture 100, CM driver circuitry 204 of receiver architecture 200, or both. CM driver circuitry 300 can include voltage generator circuitry 302, selection circuitry 304, voltage follower circuitry 306, switching circuitry 308, and resistor circuitry 310.

Voltage generator circuitry 302 can be operable to generate a plurality of voltage signals 303 of substantially different voltages. In the illustrative example shown in FIG. 3, voltage signals 303 include signals with voltages approximately equal to 0.9V, 0.85V, 0.7V, 0.6V, and 0.55V. These voltage levels can be chosen to match applications in which CM driver circuitry 300 can be used. For instance, 0.7V, 0.6V, and 0.55V might be suitable for use as transmitter CM voltages. Similarly, 0.85V might be suitable for use as a receiver CM voltage. As another example, 0.6V and 0.9V might be appropriate for generating a voltage step for receive detection, as explained in greater detail below. Any suitable voltage levels and any appropriate number of voltage signals can be used, and the invention is not limited in these respects. Voltage generator circuitry 302 can be operable to receive a current signal IBIAS, whose current level can at least partially affect the voltages of voltage signals 303.

Selection circuitry 304 can be operable to accept voltage signals 303 as inputs and select one of the voltage signals as a reference signal VREF. In an embodiment of the invention, selection circuitry 304 can include multiplexer circuitry that is operable to accept selector input signal SEL. The value of selector input signal SEL, which can include one or more bits as needed, can determine which voltage signal 303 is selected as reference signal VREF. In addition, selection circuitry 304 can preferably be operable to accept receiver detect signal RCV_DET, which can facilitate voltage stepping (e.g., for receiver detection), as explained later herein.

Voltage follower circuitry 306 can be operable to accept reference signal VREF as a first input and generate a CM output signal VCM. The voltage of CM output signal VCM can preferably be driven to substantially the voltage of reference signal VREF by voltage follower circuitry 306. In an embodiment of the invention, voltage follower circuitry 306 can include op-amp circuitry, with a second input coupled to CM output signal VCM as shown. As will be appreciated by those of skill in the art, such a configuration can be used to implement a voltage follower using the feedback loop shown in FIG. 3. Using voltage follower circuitry 306 to generate CM signal VCM can advantageously hold VCM substantially steady around the selected reference voltage VREF, thereby substantially reducing noise, jitter, or both on signal VCM. Such stabilizing effects can advantageously reduce the CMRR for differential signals coupled to CM driver circuitry 300, thereby improving signal integrity in the transceiver in which CM driver circuitry 300 is used.

Switching circuitry 308 can be coupled to a third input of voltage follower circuitry 306. The third input can also be coupled through resistor circuitry 310 to a source of relatively low voltage. Switching circuitry 308 can be operable to accept enable signal VCM_EN and selectively couple the third input of voltage follower circuitry 306 to a source of relatively high voltage in response to receiving a certain logical value of enable signal VCM_EN. In the example illustrated in FIG. 3, switching circuitry 308 can couple a voltage supply of approximately 1.2V to a power input of voltage follower circuitry 306. When this coupling occurs, voltage follower circuitry 306 can be substantially disabled, and CM output signal VCM can carry a voltage of approximately 1.2V. The voltage of the source of relatively high voltage can be chosen to suit any appropriate application. For instance, 1.2V can be a suitable CM voltage for certain receiver architectures (e.g., a legacy receiver architecture).

CM driver circuitry 300 therefore advantageously allows selection of a desired reference signal VREF from among a plurality of voltage signals 303. The selected reference signal VREF can be tracked using voltage follower circuitry 306 to generate a CM output signal VCM. By choosing a voltage signal that is appropriate for the application in which CM driver 300 is used, CM driver 300 can advantageously provide flexibility in setting transmitter and receiver CM voltages. This versatility can facilitate interoperability between different transmitter and receiver architectures, and allow any particular transceiver circuitry to be used with multiple applications. For instance, CM driver circuitry 300 can be used in transceiver circuitry of a programmable logic device ("PLD"), such as a field-programmable gate array ("FPGA"), to support a relatively wide variety of communication protocols and specifications.

If CM driver circuitry 300 is used in a transceiver where the transmitter circuitry has a different CM voltage than the receiver circuitry coupled to the transmitter circuitry, voltage follower circuitry 306 will preferably have a current sinking or sourcing path that can substantially reduce the amount of current flowing between the transmitter and receiver circuitries. For instance, if voltage follower circuitry 306 includes op-amp circuitry, voltage follower circuitry 306 can be operable to sink excess current or source deficient current, as needed, to CM output signal VCM. As a result, the shifting of the CM voltages of the transmitter and receiver circuitries can be reduced, as can problems typically associated with such shifting (e.g., settling at a level that is not valid for the transmitter circuitry, the receiver circuitry, or both). This ability for voltage follower circuitry 306 to act as a current source or sink can also alleviate the effect of P/N current mismatch from transmitter circuitry by substantially sinking or sourcing the excess or deficient current, respectively, that results from the mismatched current sources in the transmitter circuitry.

According to an embodiment of the invention, selection circuitry 304 can be operable to accept a receiver detect signal RCV_DET, which can facilitate a voltage stepping operation. As an example, suppose the value of selection signal SEL corresponds to the voltage signal carrying a voltage of approximately 0.6V and signal RCV_DET is at a first logical value (e.g., a logical "0"). When signal RCV_DET transitions to a second logical value (e.g., a logical "1"), selection circuitry 304 can be operative to switch its selection of reference signal VREF from the voltage signal of approximately 0.6V to the voltage signal of approximately 0.9V. When signal RCV_DET transitions back to the first logical value (e.g., a logical "0"), selection circuitry 304 can be operative to switch its selection of reference signal VREF from the new voltage signal of approximately 0.9V back to the original voltage signal of approximately 0.6V.

Such a configuration can be used to generate a voltage step, which can be used to perform receiver detection (e.g., in compliance with the PCI-E communication protocol). If CM output signal VCM is coupled to receiver circuitry, the voltage step (e.g., from 0.6V to 0.9V in the above example) could be affected by resistive and capacitive parasitic effects, resulting in a relatively slow and gradual transition in the transmitted differential signals. On the other hand, if CM output signal VCM is not coupled to receiver circuitry, the voltage step would be relatively unaffected by parasitic effects, resulting in a relatively fast and sharp transition in the transmitted differential signals.

Control signals SEL, RCV_DET, and VCM_EN of the invention can be provided by any suitable source. For example, any or all of these signals can be programmable, and can be stored in configuration random access memory ("CRAM"). In an embodiment of the invention, any or all of these signals can be dynamically set or programmed during operation. For example, any or all of these signals can be generated by an IP block performing a variety of logic functions. For example, a system might be operable to choose values for control signals SEL, RCV_DET, and VCM_EN that would allow the transceiver in which CM driver circuitry 300 is used to optimize a certain performance metric (e.g., speed or power consumption). Each individual channel within a system can therefore be optimized by appropriately setting the control signals of a CM driver associated with that channel.

Thus, CM driver circuitry 300 of the invention advantageously provides versatile CM driver methods and apparatus for use in transceiver technology. The same CM driver circuitry can be used in connection with transmitter circuitry, receiver circuitry, or both. CM driver circuitry 300 can provide many advantages, including selectable setting of CM voltage, reduction of current mismatch, and voltage stepping for receiver detection. In addition, noise, jitter, or both can be reduced by voltage follower circuitry 306. CM driver circuitry 300 can be implemented with relatively low area and cost, and can provide improved flexibility and performance, which can be especially beneficial in systems used in a variety of applications. For example, driver circuitry 300 can be used in transceiver circuitry of a PLD, such as a FPGA, to support a wide variety of communication protocols and specifications.

Figure 4:
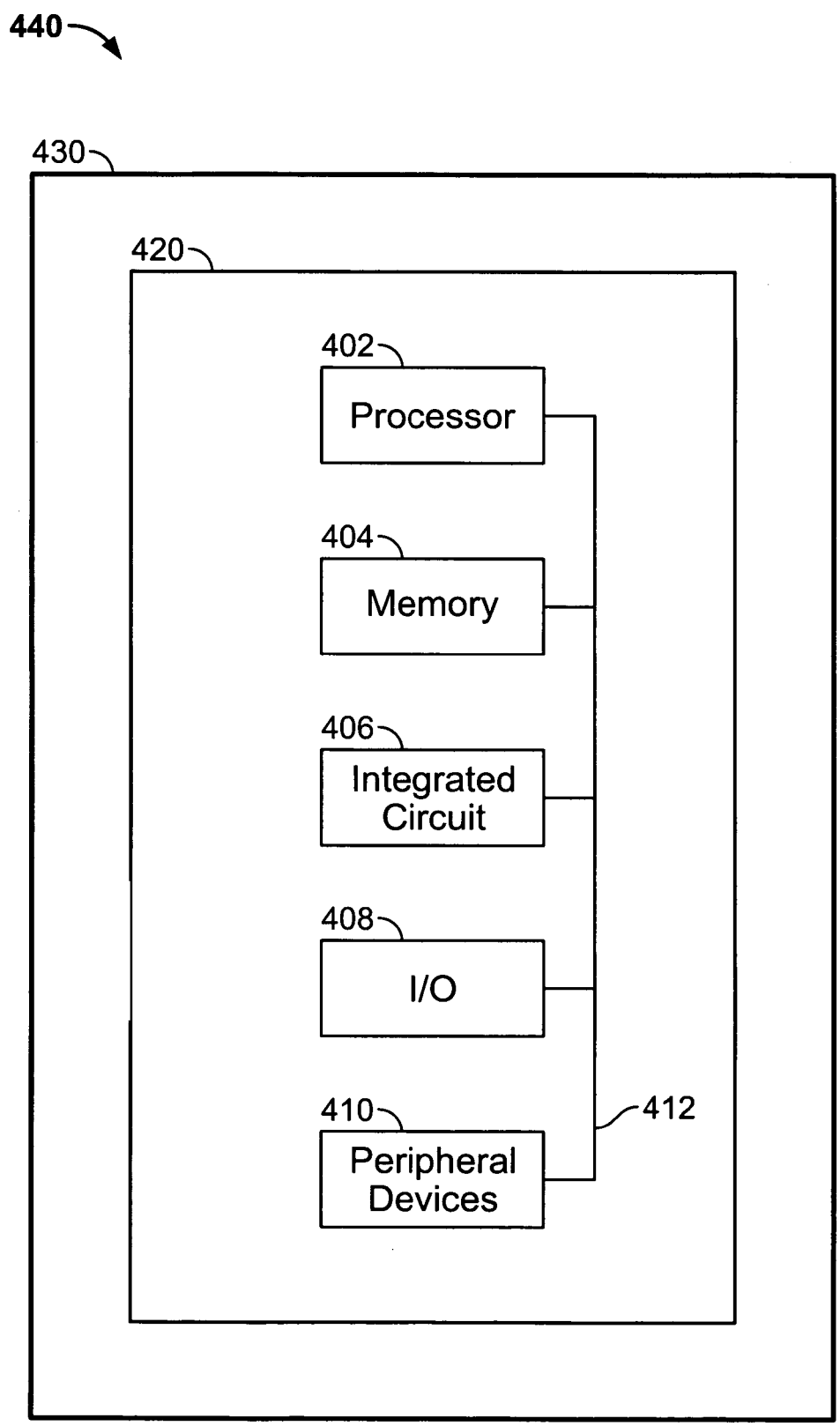
FIG. 4 is a block diagram of a data processing system incorporating the invention.

FIG. 4 illustrates an IC 406, which incorporates CM driver circuitry in accordance with this invention, in a data processing system 440. IC 406 may be a PLD, an application-specific IC ("ASIC"), or a device possessing characteristics of both a PLD and an ASIC. Data processing system 440 may include one or more of the following components: processor 402; memory 404; I/O circuitry 408; and peripheral devices 410. These components are coupled together by a system bus 412 and are populated on a circuit board 420 which is contained in an end-user system 430.

System 440 can be used in a wide variety of applications, such as computer networking, data networking, instrumentation, video processing, or digital signal processing. IC 406 can be used to perform a variety of different logic functions. For example, IC 406 can be configured as a processor or controller that works in cooperation with processor 402. IC 406 may also be used as an arbiter for arbitrating access to a shared resource in system 440. In yet another example, IC 406 can be configured as an interface between processor 402 and one of the other components in system 440.

Thus it is seen that methods and apparatus are provided for selectively setting a CM voltage in a transceiver, reducing the effect of current mismatch, and generating a voltage step that can be used for receiver detection. One skilled in the art will appreciate that the invention can be practiced by other than the described embodiments, which are presented for purposes of illustration and not of limitation, and the present invention is limited only by the claims which follow.

What is claimed is:

1. A circuit comprising:
   voltage generator circuitry operable to generate a plurality of voltage signals of substantially different voltages;
   multiplexer circuitry with voltage inputs coupled to said voltage signals, wherein said multiplexer circuitry is operable to select a reference signal from among said voltage inputs;
   operational amplifier ("op-amp") circuitry with a first input coupled to said reference signal and a second input coupled to an output signal of said op-amp circuitry, wherein said op-amp circuitry is coupled to function as a voltage follower, and wherein said multiplexer circuitry selects said reference signal independently of said op-amp circuitry;
   switching circuitry coupled to a third input of said op-amp circuitry, wherein said switching circuitry is coupled to a source of relatively high voltage; and
   resistor circuitry coupled to said third input and a source of relatively low voltage.

2. The circuit of claim 1 wherein said switching circuitry is operable to electrically couple said source of relatively high voltage to said third input in response to receiving an enable signal.

3. The circuit of claim 2 wherein said op-amp circuitry is operable to be substantially disabled in response to said electrically coupling said first voltage source to said third input.

4. The circuit of claim 1 wherein said multiplexer circuitry is operable to accept a selector input signal whose value determines which voltage input is selected as said reference signal.

5. The circuit of claim 4 wherein said selector input signal is programmable.

6. The circuit of claim 4 wherein said selector input signal is generated by intellectual property ("IP") logic.

7. The circuit of claim 4 wherein said multiplexer circuitry is operable to:
   accept a receiver detect input signal; and
   switch its selection of said reference signal from a first voltage input to a second voltage input in response to a first transition of said receiver detect input signal.

8. The circuit of claim 7 wherein said multiplexer circuitry is further operable to switch its selection of said reference signal from said second voltage input to said voltage data input in response to a second transition of said receiver detect input signal.

9. The circuit of claim 1 further comprising:
   transmitter circuitry operable to generate first and second differential output signals;
   first resistor circuitry coupled between said first differential output signal and said output signal of said op-amp circuitry; and
   second resistor circuitry coupled between said second differential output signal and said output signal of said op-amp circuitry.

10. The circuit of claim 1 further comprising:
    receiver circuitry operable to receive first and second differential input signals;
    first resistor circuitry coupled between said first differential input signal and said output signal of said op-amp circuitry; and
    second resistor circuitry coupled between said second differential input signal and said output signal of said op-amp circuitry.

11. A programmable logic device ("PLD") comprising the circuit of claim 1.

12. A circuit comprising:
    selection circuitry operable to accept a plurality of voltage signals with substantially different voltages and select one of said signals as a reference output signal;

voltage follower circuitry operable to accept said reference output signal and generate a common-mode output signal whose voltage is driven to substantially a voltage of said reference output signal by a feedback loop, wherein said selection circuitry selects said reference output signal independently of said voltage follower circuitry; and voltage generator circuitry operable to accept a current bias signal and generate said plurality of voltage signals based on a current of said current bias signal.

13. The circuit of claim 12 wherein said selection circuitry is further operable to:

accept a receiver detect signal while said voltage of said reference output signal has a first value;

set said voltage of said reference output signal to a second value in response to a first transition of said receiver detection signal; and set said voltage of said reference output signal to said first value in response to a second transition of said receiver detection signal.

14. The circuit of claim 12 wherein said voltage follower circuitry comprises operational amplifier ("op-amp") circuitry with a first input coupled to said reference output signal and a second input coupled to an output signal of said op-amp circuitry.

15. The circuit of claim 12 further comprising:

transmitter circuitry operable to generate first and second differential output signals;

first resistor circuitry coupled between said first differential output signal and said common-mode output signal; and second resistor circuitry coupled between said second differential output signal and said common-mode output signal.

16. The circuit of claim 12 further comprising:

receiver circuitry operable to receive first and second differential input signals;

first resistor circuitry coupled between said first differential input signal and said common-mode output signal; and second resistor circuitry coupled between said second differential input signal and said common-mode output signal.

17. A programmable logic device comprising the circuit of claim 12.

18. A method for generating a common-mode output signal, said method comprising:

selecting a first voltage signal from among a plurality of voltage signals with substantially different voltages;

tracking said selected first voltage signal independently of said selecting the first voltage signal, using a feedback loop to generate said common-mode output signal;

receiving a current bias signal; and generating said plurality of voltage signals in response to said receiving said current bias signal, wherein said substantially different voltages of said plurality of voltage signals are based on a current of said current bias signal.

19. The method of claim 18 further comprising:

selecting a second voltage signal from among said plurality of voltage signals in response to receiving a first transition of an input signal; and selecting said first voltage signal from among said plurality of voltage signals in response to receiving a second transition of said input signal.

20. The method of claim 18 wherein said tracking comprises:

receiving said selected first voltage signal as a first input to operational amplifier ("op-amp") circuitry;

generating said common-mode output signal as an output of said op-amp circuitry; and receiving said common-mode output signal as a second input to said op-amp circuitry.

21. The method of claim 20 further comprising substantially disabling said op-amp circuitry by coupling a third input of said op-amp circuitry to a voltage source.

* * * * *